(12) United States Patent
Javorka et al.

(10) Patent No.: US 9,484,459 B2
(45) Date of Patent: Nov. 1, 2016

(54) PERFORMANCE ENHANCEMENT IN TRANSISTORS BY PROVIDING AN EMBEDDED STRAIN-INDUCING SEMICONDUCTOR MATERIAL ON THE BASIS OF A SEED LAYER

(71) Applicant: GLOBALFOUNDRIES Inc., Grand Cayman (KY)

(72) Inventors: Peter Javorka, Radeburg (DE); Stephan Kronholz, Dresden (DE); Gunda Beernink, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/944,833

(22) Filed: Nov. 18, 2015

(65) Prior Publication Data

US 2016/0071978 A1 Mar. 10, 2016

Related U.S. Application Data

(62) Division of application No. 13/483,481, filed on May 30, 2012, now Pat. No. 9,224,863.

(30) Foreign Application Priority Data

May 30, 2011 (DE) .................. 10 2011 076 696

(51) Int. Cl.
*H01L 27/10* (2006.01)
*H01L 29/78* (2006.01)
(Continued)

(52) U.S. Cl.
CPC ... *H01L 29/7848* (2013.01); *H01L 21/823412* (2013.01); *H01L 21/823418* (2013.01);
(Continued)

(58) Field of Classification Search
CPC .................... H01L 21/0245; H01L 29/785
USPC ................. 257/402, 288, 403, 404
See application file for complete search history.

(56) References Cited

U.S. PATENT DOCUMENTS

2006/0214236 A1 9/2006 Chien
2007/0210314 A1 9/2007 Winstead et al.
(Continued)

OTHER PUBLICATIONS

Cheng et al., "Aspect Ratio Trapping Heteroepitaxy for Integration of Germanium and Compound Semiconductors on Silicon," IEEE 2008.
(Continued)

*Primary Examiner* — Samuel Gebremariam
(74) *Attorney, Agent, or Firm* — Amerson Law, PLLC (57) ABSTRACT

A semiconductor device includes drain and source regions positioned in an active region of a transistor and a channel region positioned laterally between the drain and source regions that includes a semiconductor base material and a threshold voltage adjusting semiconductor material positioned on the semiconductor base material. A gate electrode structure is positioned on the threshold voltage adjusting semiconductor material, and a strain-inducing semiconductor alloy including a first semiconductor material and a second semiconductor material positioned above the first semiconductor material is embedded in the semiconductor base material of the active region. A crystalline buffer layer of a third semiconductor material surrounds the embedded strain-inducing semiconductor alloy, wherein an upper portion of the crystalline buffer layer laterally confines the channel region including the sidewalls of the threshold voltage adjusting semiconductor material and is positioned between the second semiconductor material and the threshold voltage adjusting semiconductor material.

22 Claims, 6 Drawing Sheets (51) Int. Cl.
*H01L 29/10* (2006.01)
*H01L 29/165* (2006.01)
*H01L 29/417* (2006.01)
*H01L 29/66* (2006.01)
*H01L 21/8234* (2006.01)
*H01L 29/04* (2006.01)
*H01L 29/51* (2006.01)

(52) U.S. Cl.
CPC ....... *H01L21/823425* (2013.01); *H01L 29/04* (2013.01); *H01L 29/1054* (2013.01); *H01L 29/165* (2013.01); *H01L 29/41783* (2013.01); *H01L 29/6653* (2013.01); *H01L 29/6656* (2013.01); *H01L 29/6659* (2013.01); *H01L 29/7834* (2013.01); *H01L 29/517* (2013.01)

(56) References Cited

U.S. PATENT DOCUMENTS

| | | |
|---|---|---|
| 2008/0197412 A1 | 8/2008 | Zhang et al. |
| 2009/0075029 A1 | 3/2009 | Thomas et al. |
| 2010/0105184 A1 | 4/2010 | Fukuda et al. |
| 2010/0221883 A1 | 9/2010 | Kronholz et al. |
| 2010/0264470 A1 | 10/2010 | Thirupapuliyur et al. |

OTHER PUBLICATIONS

Houghton et al., "Equilibrium critical thickness for Si1-xGex strained layers on (100) Si," Appl. Phys. Lett., 56:460-62, Jan. 1990.
Jain et al., "A new study of critical layer thickness, stability and strain relaxation in pseudomorphic GexSi1-x strained epilayers," Philosophical Magazine A, 65:1151-67, 1992.
Kasper et al., "Strain relaxation of metastable SiGe/Si: Investigation with two complementary X-ray techniques," Journal of Applied Physics, 111:063507, 2012.
Kim et al., "Increased critical thickness for high Ge-content strained SiGe-on-Si using selective epitaxial growth," Applied Physics Letters, 97:262106, 2012.
Paul, "Silicon—Germanium Strained Layer Materials in Microelectronics," Advanced Materials, 11:191-204, 1999.
Paul, "Si/SiGe heterostructures: From material and physics to devices and circuits," Review Article submitted to Semicond. Sci. Technol.
Virginia Semiconductor, "The General Properties of Si, Ge, SiGe, SiO2 and Si3N4," Jun. 2002.
Translation of Official Communication from German Patent Application No. 10 2011 076 696.0 dated Dec. 28, 2011.

PERFORMANCE ENHANCEMENT IN TRANSISTORS BY PROVIDING AN EMBEDDED STRAIN-INDUCING SEMICONDUCTOR MATERIAL ON THE BASIS OF A SEED LAYER

BACKGROUND

1. Field of the Disclosure

Generally, the present disclosure relates to integrated circuits, and, more particularly, to transistors comprising an embedded strain-inducing semiconductor material and a high-k metal gate electrode structure formed in an early manufacturing stage.

2. Description of the Related Art

The fabrication of complex integrated circuits requires the provision of a large number of transistors, which represent the dominant circuit elements in complex integrated circuits. For example, several hundred million transistors may be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, the complementary transistors, i.e., N-channel transistors and P-channel transistors, are formed on a substrate including a crystalline semiconductor layer. A MOS transistor or generally a field effect transistor, irrespective of whether an N-channel transistor or a P-channel transistor is considered, comprises so-called PN junctions that are formed by an interface positioned between highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

When reducing the channel length of field effect transistors, generally an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, in some approaches, the inferior controllability of the channel region of the short channel transistors caused by the continuous reduction of the critical dimensions of gate electrode structures has been addressed by an appropriate adaptation of the material composition of the gate dielectric material.

To this end, it has been proposed that, for a physically appropriate thickness of a gate dielectric material, i.e., for a thickness resulting in an acceptable level of gate leakage currents, a desired high capacitive coupling may be achieved by using appropriate material systems, which have a significantly higher dielectric constant compared to the conventionally used silicon dioxide-based materials. For example, dielectric materials including hafnium, zirconium, aluminum and the like may have a significantly higher dielectric constant and are therefore referred to as high-k dielectric materials, which are to be understood as materials having a dielectric constant of 10.0 or higher when measured in accordance with typical measurement techniques. As is well known, the electronic characteristics of the transistors also strongly depend on the work function of the gate electrode material, which in turn influences the band structure of the semiconductor material in the channel regions separated from the gate electrode material by the gate dielectric layer. In well-established polysilicon/silicon dioxide-based gate electrode structures, the corresponding threshold voltage that is strongly influenced by the gate dielectric material and the adjacent electrode material is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors and the like. For this reason, corresponding metal-containing conductive materials may be positioned close to the high-k gate dielectric material in order to form an appropriately designed interface that results in the target work function of the gate electrode structure. In some conventional approaches, the work function adjustment is performed at a very late manufacturing stage, i.e., after any high temperature processes, after which a placeholder material of the gate electrode structures, such as polysilicon, is replaced by an appropriate work function adjusting species in combination with an electrode metal, such as aluminum and the like. In this case, however, very complex patterning and deposition process sequences are required in the context of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the metal species may be thermally stabilized and encapsulated in order to obtain the desired work function and thus threshold voltage of the transistors without being unduly influenced by the further processing. It turns out that, for any appropriate metal species and metal-containing electrode materials, an appropriate adaptation of the band gap of the channel semiconductor material may be required, for instance in the P-channel transistors, in order to appropriately set the work function thereof. For this reason, frequently, a so-called threshold adjusting semiconductor material, for instance in the form of a silicon/germanium mixture, is formed on the active regions of the P-channel transistors prior to forming the gate electrode structures, thereby obtaining the desired offset in the band gap of the channel semiconductor material.

The threshold adjusting semiconductor material is typically formed selectively on the silicon-based active region of the P-channel transistors while masking the active region of the N-channel transistors by an appropriate mask material, such as silicon dioxide, silicon nitride and the like. In a selective epitaxial growth process, the process parameters, such as temperature, gas flow rates and the like, are established in such a manner that a significant material deposition may be restricted to crystalline surface areas, thereby forming increasingly a silicon/germanium mixture on the silicon base material, wherein a germanium concentration, the germanium gradient in the growth direction and the finally obtained thickness in the silicon/germanium layer may thus determine the finally obtained threshold voltage for otherwise given transistor parameters. Thereafter, the gate electrode structures are formed by using high-k dielectric materials in combination with appropriate metal-containing cap layers and work function adjusting metal species, which may be incorporated into the high-k material and/or the metal-containing cap layers in order to obtain appropriate work functions and thus threshold voltages for the P-channel transistors and the N-channel transistors, respectively. In this manner, sophisticated high-k metal gate electrode structures may be provided in an early manufacturing stage, thereby avoiding a complex process strategy as required by the so-called replacement gate approach.

It is well known that, in view of enhancing overall performance of sophisticated transistors, also various strain engineering techniques are typically applied, since creating a specific type of strain in the channel region of silicon-based transistors may result in a significant increase of the charge carrier mobility, which in turn translates into superior current drive capability and thus switching speed. A plurality of strategies have thus been developed, for instance providing highly stressed layers above the completed transistor structures, providing strain-inducing sidewall spacer structures, embedding strain-inducing semiconductor alloys, such as silicon/germanium, silicon/carbon and the like, into drain and source areas of the transistors, while in other approaches, in addition to or alternatively, also globally strained semiconductor base materials may be used.

In particular, the incorporation of a strain-inducing silicon/germanium material into the active regions of P-channel transistors is a very efficient strain-inducing mechanism which, however, may interact with the threshold voltage adjusting semiconductor alloy, as will be described in more detail with reference to FIG. 1.

Figure 1:
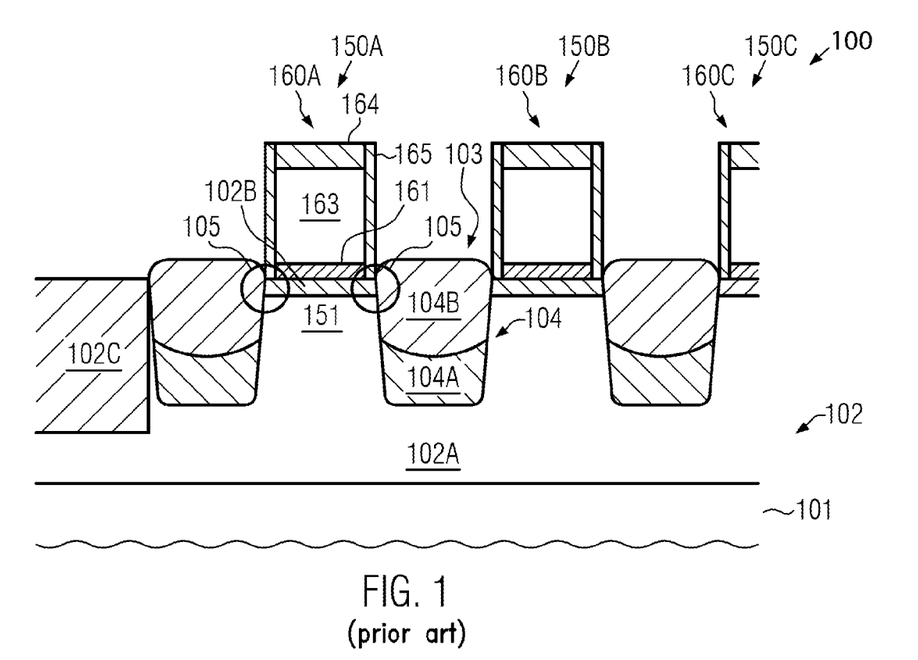
FIG. 1 schematically illustrates a cross-sectional view of a semiconductor device in a manufacturing stage in which a threshold voltage adjusting semiconductor alloy and a strain-inducing semiconductor material are formed on the basis of conventional process strategies.

FIG. 1 schematically illustrates a cross-sectional view of a semiconductor device 100 in a manufacturing stage in which a plurality of gate electrode structures 160A, 160B, 160C are formed on the active region 102A, in and above which a plurality of P-channel transistors 150A, 150B, 150C are to be formed. The active region 102A is to be understood as a part of a silicon-based semiconductor layer 102, which in turn is formed above an appropriate substrate 101, such as a silicon substrate and the like. The semiconductor layer 102, which is initially provided in the form of a continuous semiconductor material, is appropriately laterally divided into a plurality of active regions by appropriate isolation structures 102C, such as shallow trench isolations. As discussed above, the transistors 150A, 150B, 150C may represent highly complex semiconductor devices in which superior performance and reduced lateral dimensions are required so that the gate electrode structures 160A, 160B, 160C may be provided with a gate length of 40 nm and less, depending on the overall process and device requirements. It should be appreciated that the gate length is to be understood according to the sectional view of FIG. 1 as the horizontal extension of a gate electrode material 163 formed on a gate dielectric material 161, which separates the electrode material 163 from a channel region 151. Furthermore, the gate electrode structures 160A, 160B, 160C typically comprise a spacer structure 165 and, in this manufacturing stage, a dielectric cap layer or layer system 164 in order to efficiently confine the sensitive materials 163 and 161. As explained above, the gate dielectric material 161 may typically comprise a high-k dielectric material, for instance in the form of hafnium oxide and the like, possibly in combination with a conventional silicon oxide material, silicon oxynitride material and the like. Furthermore, frequently, a metal-containing electrode material (not shown) may be formed on or above the gate dielectric layer 161, for instance in order to provide the required work function of the gate electrode structures 160A, 160B, 160C.

In this manufacturing stage, the active region 102A comprises a threshold voltage adjusting semiconductor material 102B, for instance provided in the form of a silicon/germanium alloy having a germanium concentration of approximately 20-30 atomic percent, depending on the transistor requirements and the thickness of the layer 102B. That is, the finally achieved threshold voltage and other transistor characteristics significantly depend on the material 102B, i.e., on its material composition and layer thickness in combination with other characteristics, such as the configuration of drain and source regions still to be formed in the active region 102A in a later manufacturing stage. Additionally, the device 100 comprises an efficient strain-inducing mechanism on the basis of a silicon/germanium alloy 104 that is provided in respective cavities 103, which are formed in the active region 102A laterally adjacent to the respective gate electrode structures 160A, 160B, 160C. The strain-inducing effect of the silicon/germanium material 104 results from a lattice mismatch of the natural lattice constants of a silicon/germanium material compared to the silicon base material of the active region 102A. That is, the germanium atomic species having a greater covalent radius compared to silicon results, upon forming the cubic face-centered crystalline structure, in a greater lattice constant when the crystalline growth occurs in a non-disturbed manner. When forming the silicon/germanium crystal lattice on a silicon base material, which thus has a reduced lattice constant compared to the silicon/germanium alloy, the growing silicon/germanium material takes on the lattice constant of the underlying base material, thereby resulting in a deformed or strained crystalline material, which in turn may interact with the neighboring channel region 151, thereby inducing a desired compressive strain therein. Basically, the resulting strain may significantly depend on the magnitude of the lattice mismatch between the material 104 and the silicon base material of the active region 102A, wherein the actual strain in the channel region 151 is also significantly determined by the amount of strained silicon/germanium material, i.e., by the depth and shape of the cavity 103 and by the proximity of the cavity and thus the material 104 with respect to the channel region 151. Generally, it would, therefore, be preferable to provide the material 104 with reduced offset from the channel region 151 and with a high germanium concentration in order to increase the lattice mismatch and thus the resulting degree of lattice deformation and thus strain. It turns out, however, that simply increasing the germanium concentration does not necessarily result in superior transistor performance since many other aspects may also significantly contribute to the finally obtained transistor characteristics. For example, lattice defects may occur, in particular at the interface between the silicon base material and the strained semiconductor material 104, wherein the defect density may significantly increase with an increasing germanium concentration in the material 104. Furthermore, during the further processing, a pronounced difference in processing silicon material compared to a silicon/germanium material having a high germanium concentration may also contribute to process non-uniformities, for instance when forming a metal silicide in drain and source regions still to be formed and the like, which may thus also negatively affect the final transistor characteristics. For this reason, frequently a "graded" germanium concentration may be used in the material 104, for instance by providing a deeper portion 104A with a moderately high germanium concentration, for instance up to 30 percent, while an upper portion 104B may have a significantly lower germanium concentration, for instance 20 atomic percent or less. In this manner, many disadvantages associated with a high germanium concentration at a top surface of the device 100 may be avoided or at least significantly reduced by providing the graded configuration of the silicon/germanium alloy 104. On the other hand, upon further reducing the overall device dimensions, it turns out that increasingly a performance degradation as well as pronounced yield losses are observed, which are believed to be caused, on the one hand, by the presence of a silicon/germanium material of typically three different germanium concentrations, i.e., the threshold voltage adjusting material 102B, the first portion 104A and the second portion 104B of the strain-inducing semiconductor material 104, and, on the other hand, by undue effects of processes such as cleaning processes to be performed upon fabricating the device 100, as will be discussed later on in more detail.

In view of the former aspect, it is assumed that the threshold voltage adjusting semiconductor material 102B, which may have a germanium concentration of typically 20-30 atomic percent, may negatively affect the strain conditions in the channel region 151, in particular when the germanium concentration differs from the germanium concentration in the portions 104B and 104A. For example, in a critical zone 105, silicon/germanium materials of three different material compositions may have to be grown on the silicon base material, thereby resulting in a pronounced degree of defects, such as dislocations and the like, which may reduce the finally achieved compressive strain in the channel region 151.

With respect to the latter aspect affecting the processing and thus the final performance of the transistors 150A, 150B, 150C, it is to be noted that, during many critical process phases, appropriate etch chemistries or cleaning chemistries, such as hot APM (ammonium and hydrogen peroxide mixture) have to be applied, for instance upon removing a portion of the spacer structure 165 and the like, wherein the critical zone 105 may have a reduced etch resistivity, which may, therefore, result in the pronounced etch attack, which in turn may compromise integrity of sensitive materials in the gate electrode structures 160A, 160B, 160C or which may generally result in a device deterioration due to a threshold voltage shift and the like.

Generally, the device 100 can be fabricated on the basis of any appropriate process strategy. For example, the active region 102A may be formed by appropriately dimensioning and forming the isolation structure 102C, which in turn is typically accomplished by applying sophisticated lithography, etch, deposition, anneal and planarization techniques. Thereafter, the basic electronic characteristics of the active region 102A are adjusted, for instance, by applying implantation processes and using an appropriate masking regime. Next, the threshold voltage adjusting semiconductor alloy 102B is selectively formed on active regions in which the adjustment of the threshold voltage requires an adaptation or a shift of the band gap energy with respect to other active regions, such as the active regions of N-channel transistors and the like. To this end, typically, an appropriate hard mask material is provided so as to cover other active regions and expose, for instance, the active region 102A to a selective epitaxial growth ambient in which process parameters are selected in compliance with well-established process recipes so as to achieve the deposition of the silicon/germanium material on exposed crystalline silicon surface areas, while a pronounced material deposition on dielectric surface areas such as the cap layers 164, the spacer structures 165 and the isolation regions 102C is suppressed. Thereafter, any hard mask materials from other active regions are removed and the processing is continued by forming gate electrode structures, such as the structures 160A, 160B, 160C. To this end, appropriate materials are formed, for instance, by deposition, wherein, as discussed above, a high-k dielectric material is typically provided in combination with appropriate metal-containing electrode materials, such as titanium nitride and the like, in order to obtain a desired confinement of the sensitive high-k dielectric material and also provide an appropriate work function. To this end, it is frequently necessary to incorporate an additional metal species, such as aluminum and the like, into the metal-containing electrode material and/or into the dielectric layer 161, which may be accomplished by applying appropriate heat treatments and the like. Thereafter, typically, a further electrode material is deposited, such as a polysilicon material and the like, followed by the deposition of any further hard mask materials and cap materials as required. Next, complex lithography and etch techniques are applied in order to form the gate electrode structures 160A, 160B, 160C with the desired critical dimensions. Thereafter, a liner material (not shown) is typically formed, for instance as a silicon nitride material, so as to confine any sensitive materials of the gate electrode structures on sidewalls thereof, followed by the formation of the spacer structure 165, which may in other device areas be used as a mask layer during a process sequence in which the cavities 103 may be selectively formed in the active region 102A, followed by the selective epitaxial deposition of the material 104. To this end, well-established process techniques are applied for forming the cavities 103, followed by a selective deposition sequence for forming the materials 104A, 104B, wherein process parameters such as the gas flow rate of a germanium-containing precursor gas are appropriately adjusted in order to obtain a desired graded germanium concentration, as discussed above. Thereafter, in some strategies, the spacer structure 165, acting as an offset spacer for defining the lateral offset of the cavities 103, may be removed, which may include the application of efficient chemical recipes which, as discussed above, may result in pronounced damage, in particular in the zone 105, due to the reduced etch resistivity.

Consequently, the further processing has to be continued on the basis of a degraded device configuration, in particular within the critical zone 105, thereby also affecting the overall transistor characteristics, such as threshold voltage and the like, while also a significant reduction of the production yield is observed upon completing the transistors 150A, 150B, 150C by forming drain and source regions and the like.

In view of the situation described above, the present disclosure relates to manufacturing techniques and semiconductor devices in which sophisticated transistors may be formed on the basis of an embedded strain-inducing semiconductor material, while avoiding or at least reducing the effects of one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure provides semiconductor devices and manufacturing techniques in which an embedded strain-inducing semiconductor alloy, such as a silicon/germanium alloy and the like, may be formed with any appropriate concentration profile with a reduced defect rate by providing an appropriate "seed layer" or "buffer layer" prior to actually depositing the strain-inducing semiconductor material. Moreover, in combination with a threshold voltage adjusting semiconductor alloy, overall performance and increased production yield may be accomplished due to superior strain efficiency of the embedded semiconductor material in combination with a superior etch resistivity in view of wet chemical cleaning and etch recipes.

One illustrative semiconductor device disclosed herein includes drain and source regions positioned in an active region of a transistor, the active region including a semiconductor base material, and a channel region positioned laterally between the drain and source regions, the channel region including a portion of the semiconductor base material and a threshold voltage adjusting semiconductor material positioned on the portion of the semiconductor base material. The illustrative semiconductor device also includes, among other things, a gate electrode structure positioned on the threshold voltage adjusting semiconductor material, and a strain-inducing semiconductor alloy embedded in the active region, the strain-inducing semiconductor alloy including a first semiconductor material embedded in the semiconductor base material and a second semiconductor material embedded in the semiconductor base material, wherein the second semiconductor material is positioned above the first semiconductor material and laterally adjacent to the threshold voltage adjusting semiconductor material. Additionally, the disclosed semiconductor device further includes a crystalline buffer layer of a third semiconductor material surrounding the embedded strain-inducing semiconductor alloy, wherein an upper portion of the crystalline buffer layer laterally confines the channel region including sidewalls of the threshold voltage adjusting semiconductor material and is positioned between the second semiconductor material and the threshold voltage adjusting semiconductor material.

Another exemplary semiconductor device in accordance with the presently disclosed subject matter includes a first crystalline semiconductor material positioned on a semiconductor base material of an active region of the semiconductor device and having a first lattice mismatch with respect to the semiconductor base material, and a gate electrode structure positioned on the first crystalline semiconductor material. Additionally, the disclosed semiconductor device further includes a second crystalline semiconductor material embedded in the semiconductor base material of the active region and having a second lattice mismatch with respect to the semiconductor base material, and a third crystalline semiconductor material embedded in the semiconductor base material of the active region, the third crystalline semiconductor material being positioned on the second crystalline semiconductor material and laterally adjacent to the first crystalline semiconductor material and having a third lattice mismatch with respect to the semiconductor base material. Moreover, the exemplary semiconductor device also includes a liner layer of a fourth crystalline semiconductor material, wherein the liner layer surrounds the second and third crystalline semiconductor materials embedded in the semiconductor base material, separates the second crystalline semiconductor material from the semiconductor base material, and separates the third crystalline semiconductor material from the first crystalline semiconductor material, the fourth crystalline semiconductor material having a fourth lattice mismatch with respect to the semiconductor base material that is less than each of the first lattice mismatch, the second lattice mismatch, and the third lattice mismatch.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which an embedded strain-inducing semiconductor material, such as a silicon/germanium alloy, a silicon/carbon alloy and the like, may be provided with any appropriate concentration profile of a strain-inducing atomic species, i.e., an atomic species having a different covalent radius compared to the atomic species of the semiconductor base material of a corresponding active region, by incorporating an appropriate seed layer or buffer layer having a significantly different material composition with respect to the resulting lattice mismatch compared to the strain-inducing semiconductor material. In this manner, the embedded strain-inducing material may be confined, at least across a certain portion of surface areas of the cavities, which may be particularly advantageous in the context of device configurations in which a threshold voltage adjusting semiconductor alloy is provided. In this case, the seed layer or buffer layer of reduced lattice mismatch, wherein, in some illustrative embodiments, the seed layer or buffer layer may have substantially the same material composition as the semiconductor base material, may therefore efficiently separate the threshold voltage adjusting semiconductor material and the strain-inducing semiconductor material thereby reducing the degree of lattice defects in a critical zone of the active region, while at the same time also increasing etch resistivity with respect to a plurality of wet chemical processes, for instance performed on the basis of APM and the like.

To this end, in some illustrative embodiments, the seed layer or buffer layer may be formed on at least some exposed surface areas of the cavities prior to actually depositing the strain-inducing semiconductor material, wherein the buffer layer is at least provided on any exposed surface areas of a threshold voltage adjusting semiconductor material, thereby efficiently providing a different template material for the growth of the strain-inducing semiconductor material in this area. In other illustrative embodiments, the growth of the seed layer or buffer layer may be initiated in an intermediate state of depositing the strain-inducing semiconductor material, which may be provided on the basis of epitaxial growth recipes in which a superior bottom to top growth mechanism is applied. In this manner, the buffer material may be provided in a locally restricted manner, while nevertheless providing the desired buffer effect in a critical zone of the active region in which semiconductor alloys of different material composition are provided in close proximity to each other.

With reference to FIGS. 2a-2e and 3a-3c, further illustrative embodiments will now be described in more detail, wherein reference may also be made to FIG. 1 and the corresponding description, if required.

Figure 2A:
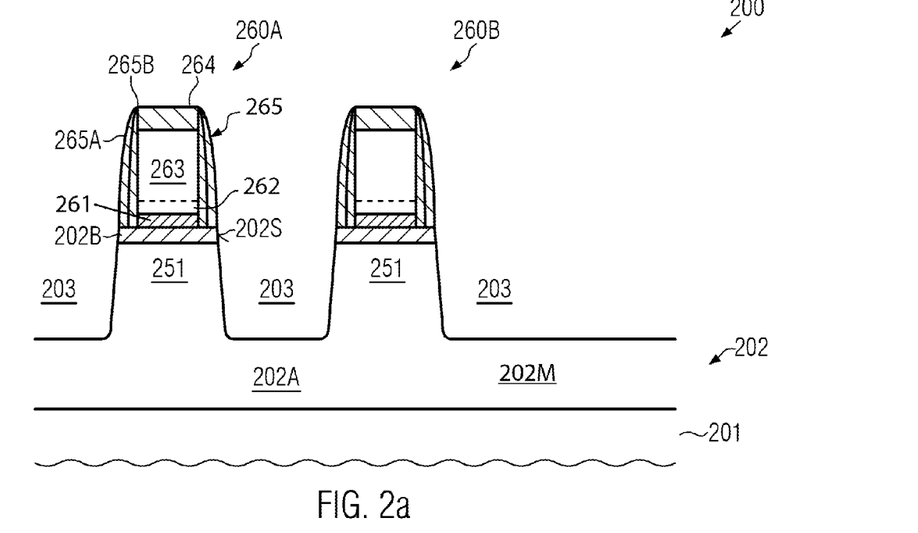
FIGS. 2a-2e schematically illustrate cross-sectional views of a semiconductor device during various manufacturing stages when an embedded strain-inducing semiconductor material may be formed on the basis of a seed layer or buffer layer, according to illustrative embodiments.

FIG. 2a schematically illustrates a cross-sectional view of a semiconductor device 200 comprising a substrate 201, such as a semiconductor material and the like, above which may be formed a semiconductor layer 202, such as a silicon material, a silicon/germanium material and the like. It should be appreciated that the semiconductor layer 202 may directly connect to a crystalline semiconductor material of the substrate 201, thereby forming a bulk configuration. In other cases, a buried insulating layer (not shown) may be formed below the semiconductor layer 202, thereby providing a silicon-on-insulator (SOI) architecture. The semiconductor layer 202 may comprise a plurality of active regions, which are generally to be understood as a semiconductor region in and above which one or more transistors are to be formed. For convenience, a single active region 202A is illustrated, which may be laterally delineated by appropriate isolation structures (not shown), as is for instance also discussed above with reference to the device 100 described in the context of FIG. 1. The active region 202A comprises a semiconductor base material 202M having any appropriate configuration, wherein, in some illustrative embodiments, the base material 202M may be a silicon material which may contain a certain degree of dopant species and the like. In this case, the concentration of a silicon species may be 99 atomic percent or higher while, however, in other illustrative embodiments, a different silicon concentration may be used if considered appropriate for the characteristics of transistors to be formed in and above the active region 202A. Moreover, in the embodiment shown, the active region 202A may additionally comprise a threshold voltage adjusting semiconductor material 202B, such as a silicon/germanium material or alloy having an appropriate layer thickness and material composition, as discussed above. For example, when using a silicon/germanium alloy, the germanium concentration may be 20-30 percent, depending on the desired band gap offset to be obtained. Furthermore, gate electrode structures 260A, 260B may be formed on respective portions of the material 202B and may have any appropriate configuration, for instance comprising a gate dielectric layer 261 including a high-k dielectric material, such as hafnium oxide, zirconium oxide and the like, possibly in combination with conventional dielectrics, as is also discussed above. Furthermore, in some illustrative embodiments, one or more metal-containing electrode materials 262 may be provided, for instance in the form of titanium nitride, tantalum and the like, possibly in combination with an additional work function adjusting metal species, as is also explained above in the context of FIG. 1. Furthermore, a further electrode material 263, such as amorphous silicon, polycrystalline silicon and the like, may be provided in combination with a cap layer or cap layer system 264. Furthermore, a spacer structure 265 which may include a liner material 265B and a spacer element 265A may be provided so as to protect any sensitive gate materials and define a desired lateral offset of cavities 203 with respect to a channel region 251.

The semiconductor device 200 as illustrated in FIG. 2*a* may be formed on the basis of any appropriate process strategy, as is for instance also discussed above with respect to the semiconductor device 100. That is, after forming any isolation structures (not shown) and adjusting the basic characteristics of the active region 202A, the material layer 202B may be formed by selective epitaxial growth techniques in order to provide the layer 202B with the desired material composition and layer thickness. As also previously discussed, the material composition 202B that differs from the material composition of the base layer 202M in order to obtain the desired shift in band gap and the like may also result in a certain lattice mismatch with respect to the base material 202M. Basically, the lattice mismatch may be defined as a ratio obtained of the lattice constants of a non-deformed crystalline material of the layer 202B having the same material composition and the lattice constant of the non-deformed base material 202M.

Thereafter, the gate electrode structures 260A, 260B may be formed by providing the materials 261, 262, which may be patterned in order to provide different characteristics in different device areas, for instance with different characteristics in active regions of different transistor types, which may be accomplished on the basis of any well-established process strategies. In other cases, at least the material 261 may commonly be provided for a plurality of transistor types, depending on the overall process strategy. Thereafter, the materials 263, 264 may be provided and subsequently the resulting layer stack may be patterned, as described above. Thereafter, the spacer structure 265 may be formed, for instance by first providing the liner 265B, possibly patterning the liner, followed by the deposition and patterning of a spacer material in order to form the spacer 265A, which, in some illustrative embodiments, may represent a "disposable" spacer element that may have to be removed in a later manufacturing stage. It should further be appreciated that other device areas may be covered by a mask layer when the formation of the cavities 203 in the strain-inducing semiconductor material is to be avoided in this manufacturing stage.

Thereafter, the cavities 203 may be formed by applying any appropriate etch technique, such as plasma enhanced etch recipes, wet chemical etch chemistries or any combination thereof. Consequently, during this patterning process, also the previously continuous layer 202B formed on the active region 202A may be patterned, thereby exposing sidewall areas 202S thereof. Thereafter, the device may be prepared for a subsequent selective epitaxial growth process, which may involve cleaning processes and the like.

Figure 2B:
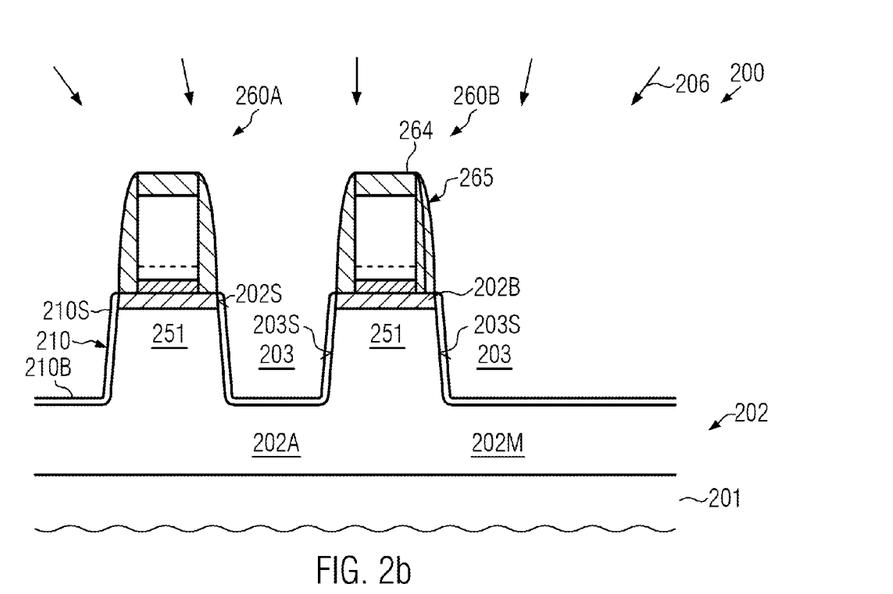

FIG. 2*b* schematically illustrates the device 200 in a further advanced manufacturing stage. As shown, a selective epitaxial growth process 206 may be applied so as to form a crystalline semiconductor material in the form of a liner 210 at least on some exposed surface areas 203S of the cavities 203. To this end, established deposition recipes may be applied wherein, in particular, the precursor gases are selected so as to obtain the desired material composition for the liner 210. In some illustrative embodiments, the material composition of the liner 210 is highly similar to the material composition of the base material 202M so that a corresponding lattice mismatch between the material 210 and the base material 202M may be substantially zero and may, at any rate, be less compared to the lattice mismatch of the layer 202B relative to the semiconductor base material 202M. When the base material 202M may comprise a silicon content of 99 atomic percent or higher, the silicon content of the material 210 may be 90 percent or higher, and, in some illustrative embodiments, this content may be 99 atomic percent or higher. As is well known, during the selective epitaxial growth process, parameters, such as pressure, temperature and the like, may be appropriately adjusted so as to preferably initiate adhesion of material on exposed crystal surface areas, wherein even a certain degree of selectivity between different surface orientations may be observed. For example, the active region 202A may be provided in a standard crystallographic configuration, i.e., a vertical surface of the base material 202M in FIG. 2*b* may correspond to a (110) crystal plane, while a substantially horizontal surface area may correspond to a (100) crystal plane. Consequently, during the process 206, the process parameters may be selected so as to obtain similar growth rates for both crystal planes so that a bottom layer 210B may have a similar thickness compared to a side layer 210S of the liner 210. It should be appreciated, however, that also a different ratio of the corresponding growth rates may be selected by adjusting the process parameters. For example, an increased growth rate at the sidewalls of the cavities 203 may be selected so as to reliably cover the sidewall surface areas 202S of the material 202B. For example, an average thickness of the liner 210 may be selected to be one nanometer to several nanometers, such as 5-10 nm, depending on the desired "decoupling" effect of the liner 210.

Figure 2C:
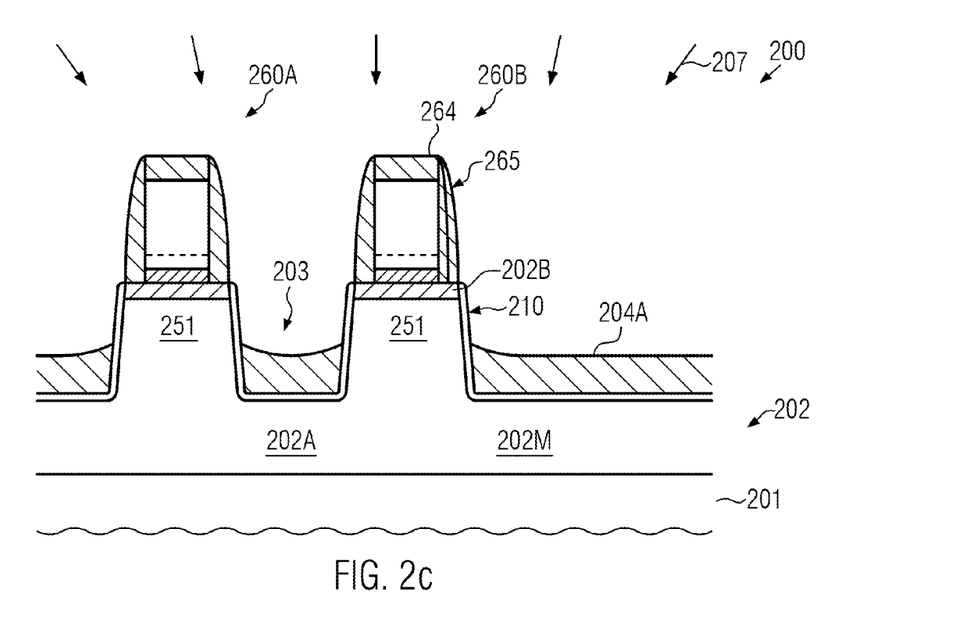

FIG. 2*c* schematically illustrates the device 200 in a further advanced manufacturing phase in which the device 200 is exposed to a further selective deposition atmosphere 207 in which at least a portion of a strain-inducing semiconductor material, indicated by 204A, may be formed in the cavities 203 and thus at least on a portion of the previously deposited liner 210. To this end, the deposition process 207 may be performed on the basis of well-established selective epitaxial growth recipes wherein the liner 210 may act as an efficient template material in order to grow the material portion 204A with a desired lattice configuration. As discussed above, the material composition 204A may differ from the material composition of the base material 202M and may thus also differ from the material composition of the liner 210. Hence, the lattice mismatch of the material 204A may differ from the lattice mismatch of the liner 210 and is intended to induce a desired type of strain in the channel regions 251, as explained above. In some illustrative embodiments, the lattice mismatch of the material 204A may be greater than the lattice mismatch of the material 202B, even if the same type of atomic species may be provided in these materials. For example, the material 204A may be provided in the form of a silicon/germanium alloy having a germanium concentration of approximately 25-30 atomic percent or even higher, depending on the overall required transistor characteristics.

Figure 2D:
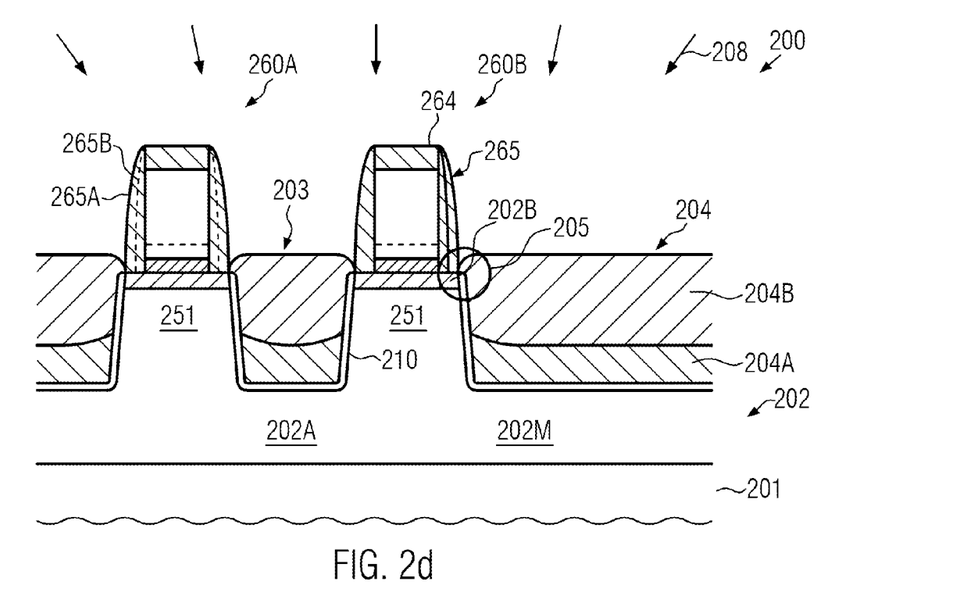

FIG. 2*d* schematically illustrates the device 200 in a further advanced manufacturing stage. As shown, a strain-inducing semiconductor material 204 may completely fill the cavities 203 or may be provided with an excess height, if required for the further processing. To this end, the device 200 may be treated in a further selective deposition atmosphere 208, thereby forming a material 204B, which, in some illustrative embodiments, may have a different material composition, for instance in terms of a concentration of a strain-inducing atomic species compared to the previously deposited portion 204A. For example the material 204B, when provided on the basis of a silicon/germanium alloy, may have a reduced germanium concentration and thus a reduced lattice mismatch compared to the material 204A, thereby providing a graded concentration profile of the material 204, which may be advantageous in some transistor configurations, as previously also discussed with reference to the device 100. On the other hand, an average lattice mismatch of the material 204, i.e., of the portions 204A, 204B, may still be significantly higher compared to a lattice mismatch of the liner 210, if this liner material has a lattice mismatch at all with respect to the base material 202M. The deposition atmosphere 208 may also be established on the basis of well-established process recipes. In some illustrative embodiments, the processes 206, 207 (FIGS. 2b, 2c) and 208 may be performed in the same process reactor so that these processes may be considered as an in situ process, i.e., a process without requiring any transport activities of the device 200 between the various deposition steps.

Hence, due to the presence of the liner material 210, the cavities 203 may be filled with the material 204 having any desired concentration profile, while at the same time a separation with respect to the material 202B is accomplished.

It should be appreciated that the material 204 may generally be provided with any desired concentration profile, for instance as a substantially uniform material or with a more sophisticated concentration profile in the lateral and vertical direction, as may be required for adjusting desired transistor characteristics. Moreover, it is to be noted that the deposition of the materials 204A, 204B may also include the adjustment of a desired selection of a ratio of selectivity of the various crystal planes, for instance so as to promote a bottom to top growth, while in other cases (not shown) a substantially similar growth rate for the vertical and horizontal directions may be used.

Thereafter, the further processing may be continued by, for instance, removing a portion of the spacer structure 265, such as the spacer element 265A, which may be accomplished on the basis of wet chemical recipes, for instance using APM and the like, wherein the superior crystalline structure and the presence of the liner 210 in a critical zone 205, i.e., in a zone where different material compositions having different lattice mismatches are provided in close proximity to each other, may result in reduced etch damage, thereby providing superior conditions during the further processing.

Figure 2E:
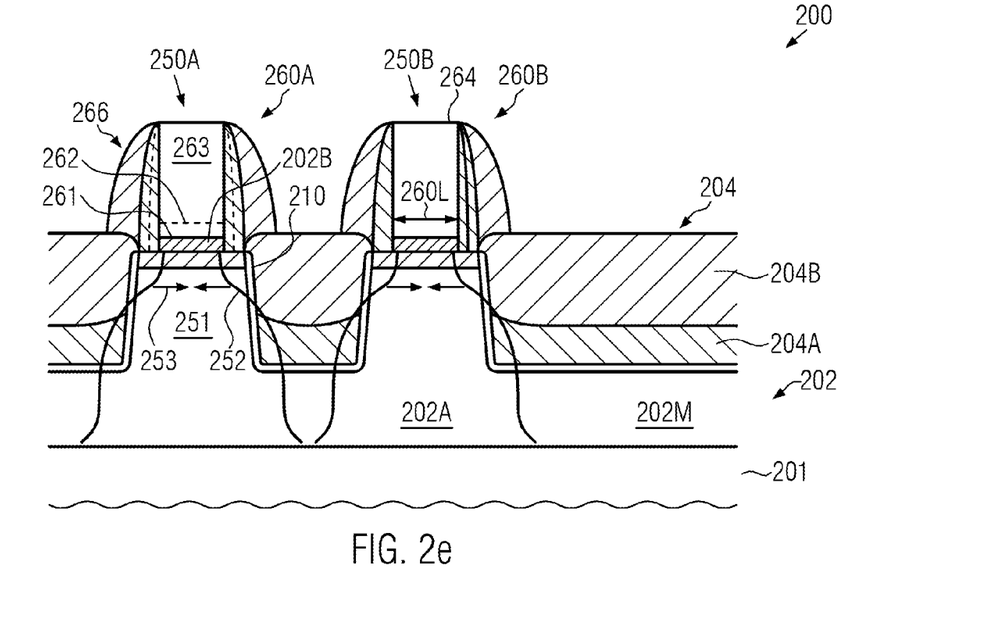

FIG. 2e schematically illustrates the device 200 in a further advanced manufacturing stage. As shown, transistors 250A, 250B may be formed in and above the active region 202A and may have drain and source regions 252, which may at least partially be formed within the strain-inducing semiconductor material 204. As explained above, due to the presence of the material 204 having a reduced number of lattice defects, in particular in the vicinity of the material 202B, the resulting strain 253 in the channel region 251 may be enhanced compared to a conventional device having otherwise identical transistor parameters. Furthermore, due to the superior etch resistivity as discussed above, integrity of the gate electrode structures 260A, 260B may be preserved during the further processing, for instance when forming an appropriate spacer structure 266 and removing any dielectric cap materials 264 and the like.

The device 200 as illustrated in FIG. 2e may be formed on the basis of any appropriate process strategy, for instance forming the drain and source regions 252 on the basis of implantation techniques, while also a portion of the drain and source dopant species may be incorporated upon depositing the material 204 and possibly the liner 210 by incorporating the desired dopant species into the respective deposition atmosphere. It should further be noted that a portion of the drain and source regions 252 may be formed prior to or after forming the material 204, depending on the overall process strategy. Moreover, the spacer structure 266 may be provided with any appropriate configuration so as to act as an efficient implantation mask for adjusting the lateral and vertical profile of the drain and source regions 252. After any high temperature processes, the further processing may be continued, for instance, by forming a metal silicide in the electrode material 263 and the drain and source regions 252, followed by the deposition of appropriate dielectric materials in order to enclose and thus passivate the transistors 250A, 250B. Thereafter, appropriate contact elements may be provided on the basis of well-established process strategies.

Figure 3A:
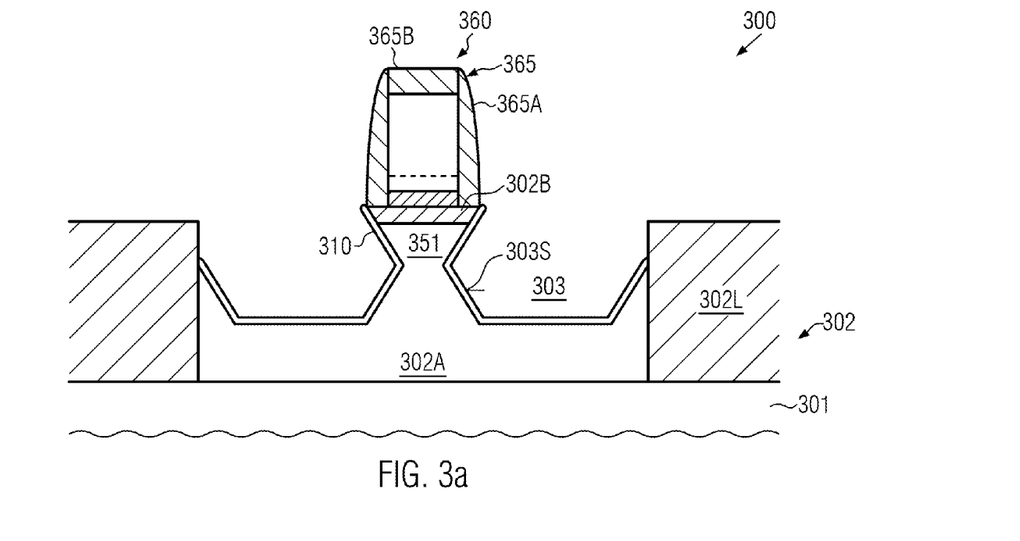
FIGS. 3a-3c schematically illustrate cross-sectional views of a further semiconductor device during various manufacturing stages in which a seed layer or buffer layer may be provided in a hexagonal shaped cavity, according to still other illustrative embodiments.

FIG. 3a schematically illustrates a cross-sectional view of a semiconductor device 300 comprising a substrate 301 and a semiconductor layer 302, which may be divided into a plurality of active regions on the basis of an appropriate isolation structure 302L, wherein, for convenience, a single active region 302A is illustrated in FIG. 3a. A gate electrode structure 360 may be formed on the active region 302A and may have any appropriate configuration, as is also discussed above with reference to the semiconductor devices 100 and 200. Furthermore, a threshold voltage adjusting semiconductor material 302B may be provided as a part of the active region 302A, as is also explained above. It should generally be appreciated that the components described so far may have a similar configuration and may be formed by similar process techniques, as are also discussed above with respect to the devices 100 and 200. Furthermore, in the manufacturing stage shown, cavities 303 may be formed in the active region 302A and may have a desired cross-sectional shape and size in order to comply with the requirements of a transistor still to be formed. In the embodiment shown, a hexagonal cavity may be provided wherein inclined sidewall spacer areas 303S may delineate the cavities 303 with respect to a channel region 351. For example, the surface areas 303S may substantially correspond to (111) crystal planes. To this end, the device 300 may be formed in accordance with process strategies previously described and, after forming the gate electrode structure 360, the cavities 303 may be formed, for instance, by first applying an anisotropic etch process and subsequently adjusting the final size and shape of the cavities 303 by using a crystallographically anisotropic etch technique, for instance on the basis of well-established wet chemical recipes using TMAH (tetra methyl ammonium hydroxide), potassium hydroxide and the like. During the crystallographically anisotropic etch process, the (111) crystal planes may act as efficient etch stop layers thereby enabling a precise control of the size and shape of the cavities 303. Thereafter, a selective epitaxial growth process may be applied so as to form a crystalline liner 310, at least on a portion of any exposed surface areas of the cavities 303, wherein, in some illustrative embodiments, process parameters are selected so as to preferably deposit material on the inclined surface areas 303S, while material deposition on horizontal surface areas may be reduced, thereby obtaining a reduced layer thickness. In other cases, a similar growth rate may be selected for any exposed surface area if a substantially complete coverage of any exposed surface areas of the cavities 303 is considered appropriate.

Figure 3B:
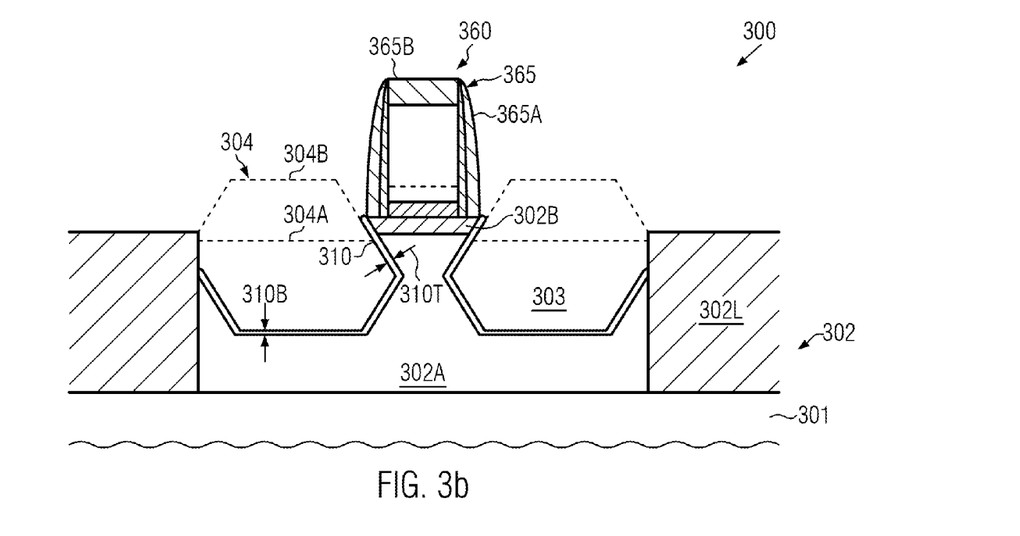

FIG. 3b schematically illustrates the device 300 in a further advanced manufacturing stage. As shown, a strain-inducing semiconductor material 304 may be provided so as to fill the cavities 303, wherein any desired profile of the material composition of the material 304 may be adjusted, as is also discussed above. For example, a first portion 304A having a moderately high lattice mismatch with respect to the base material of the active region may be provided, followed by a second portion 304B having a significantly reduced lattice mismatch so as to provide superior conditions during the further processing of the device 300. Moreover, as illustrated, the growth of the material 304 upon performing the respective selective epitaxial growth processes may be adjusted so as to obtain a bottom-to-top fill behavior wherein material growth on the inclined (111) surface areas may be reduced. On the other hand, the liner 310 may reliably "decouple" the material 304 from the material 302B, which may differ in material composition and thus lattice mismatch. Upon filling the cavities 303, a device configuration may be obtained in which the material 304 may have any appropriate profile with respect to material composition, however, without inducing undue lattice defects in the vicinity of the threshold voltage adjusting semiconductor material 302B. Moreover, the liner 310 having a similar material composition compared to the base material of the active region may have been formed with a desired thickness 310T at the inclined surface areas, while a thickness 310B at horizontal surface areas may be similar or may be significantly reduced, depending on the previously applied process strategy, as discussed above.

Figure 3C:
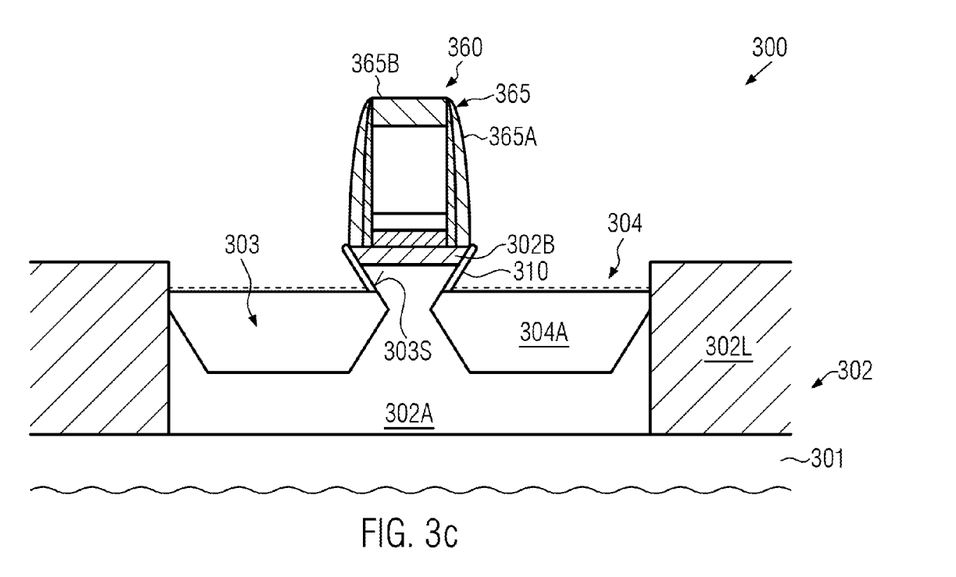

FIG. 3c schematically illustrates the device 300 according to still further illustrative embodiments. As shown, a first portion 304A of the strain-inducing material 304 may be formed in the cavities 303 so as to fill these cavities up to a desired level, which may be accomplished by selecting appropriate deposition parameters in order to initiate a deposition substantially from bottom to top. In this case, a material deposition on the surface areas 303S, i.e., on (111) planes, may be efficiently suppressed. Thereafter, the deposition atmosphere may be changed, for instance, by reducing or discontinuing supply of strain-inducing atomic species and also change parameters so as to preferably deposit material on (111) planes in order to form the liner 310 on the remaining portion of the inclined surface areas 303S. Consequently, the material 310 having the desired buffer effect may be reliably provided so as to separate the material 302B from a further portion of the material 304 still to be formed in the cavities 303. It should be appreciated that a certain amount of material of the liner 310, when deposited on the material 304A, as indicated by the dashed line, may substantially not affect the overall strain-inducing effect of the material 304. Thereafter, the processing may be continued by depositing a remaining portion of the material 304, possibly with a different material composition compared to the portion 304A, when considered appropriate in view of the overall device requirements. Thereafter, the further processing may be continued, as is also described above.

It should be appreciated that any of the process techniques and component described with reference to FIGS. 3a-3c may also be efficiently incorporated or implemented in the device 200 as described with reference to FIGS. 2a-2e.

As a result, the present disclosure provides manufacturing techniques and semiconductor devices in which a strain-inducing semiconductor material may be incorporated into the active region by providing a seed layer or buffer layer at least between a threshold voltage adjusting semiconductor material and the strain-inducing semiconductor alloy. In this manner, the number of lattice defects may be reduced and the overall strain-inducing efficiency may be enhanced. Furthermore, superior etch resistivity with respect to wet chemical agents, such as APM, may be achieved. It should be appreciated that, in the above-described embodiments, it is mainly referred to a silicon/germanium alloy or material for the threshold voltage adjusting semiconductor alloy and the strain-inducing material. In other illustrative embodiments, when a compressive strain is required in the channel region of the transistor under consideration, any species having a greater covalent radius compared to silicon or generally compared to the semiconductor base material may be incorporated, for instance by using tin, possibly in combination with germanium and the like. Furthermore, the threshold voltage adjusting semiconductor material may have incorporated therein other atomic species compared to germanium if considered appropriate for adjusting the overall electronic characteristics. Moreover, other strain-inducing atomic species, such as carbon, phosphorous and the like, may be used, if appropriate, for enhancing overall performance of the transistor under consideration. Thus, efficient strain-inducing mechanisms may be implemented on the basis of an embedded strain-inducing semiconductor material, which may have a graded concentration profile, wherein the additional buffer material may enable a further scaling of critical dimensions so as to form transistors having a gate length of 40 nm and significantly less. Moreover, due to the efficient buffer effect, generally the concept of providing sophisticated gate electrode structures including a high-k dielectric material and a metal-containing electrode material may be extended to reduced gate lengths without unduly increasing overall yield losses.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   drain and source regions positioned in an active region of a transistor, said active region comprising a semiconductor base material;
   a channel region positioned laterally between said drain and source regions, said channel region comprising a portion of said semiconductor base material and a threshold voltage adjusting semiconductor material positioned on said portion of said semiconductor base material;
   a gate electrode structure positioned on said threshold voltage adjusting semiconductor material;
   a strain-inducing semiconductor alloy embedded in said active region, said strain-inducing semiconductor alloy comprising:
     a first semiconductor material embedded in said semiconductor base material; and
     a second semiconductor material embedded in said semiconductor base material, wherein said second semiconductor material is positioned above said first semiconductor material and laterally adjacent to said threshold voltage adjusting semiconductor material; and
   a crystalline buffer layer comprising a third semiconductor material, said crystalline buffer layer laterally surrounding said embedded strain-inducing semiconductor alloy, wherein an upper portion of said crystalline buffer layer laterally confines sidewalls of said threshold voltage adjusting semiconductor material and is positioned between and laterally separates said second semiconductor material and said threshold voltage adjusting semiconductor material.

2. The semiconductor device of claim 1, wherein a lower portion of said crystalline buffer layer separates said strain-inducing semiconductor alloy from said semiconductor base material.

3. The semiconductor device of claim 1, wherein said first semiconductor material comprises a strain-inducing atomic species and has a first material composition, wherein said second semiconductor material comprises said strain-inducing atomic species and has a second material composition, and wherein said third semiconductor material has a third material composition that is different from said first and second material compositions.

4. The semiconductor device of claim 3, wherein said first semiconductor material has a first concentration of said strain-inducing atomic species and said second semiconductor material has a second concentration of said strain-inducing atomic species that is different from said first concentration.

5. The semiconductor device of claim 3, wherein said threshold voltage adjusting semiconductor material comprises said strain-inducing atomic species, said atomic species having a covalent radius that is greater than a covalent radius of silicon.

6. The semiconductor device of claim 5, wherein a concentration of said atomic species in each of said threshold voltage adjusting semiconductor material and said first and second semiconductor materials is approximately 10 atomic percent or higher.

7. The semiconductor device of claim 1, wherein a lattice mismatch of said third semiconductor material to said semiconductor base material is less than a lattice mismatch of said first semiconductor material to said semiconductor base material.

8. The semiconductor device of claim 7, wherein said third semiconductor material comprises a silicon with a concentration of 90 atomic percent or higher.

9. The semiconductor device of claim 7, wherein said third semiconductor material comprises a silicon with a concentration of 99 atomic percent or higher.

10. The semiconductor device of claim 1, wherein a lattice mismatch of said third semiconductor material to said semiconductor base material is less than a lattice mismatch of said threshold voltage adjusting semiconductor material to said semiconductor base material.

11. The semiconductor device of claim 1, wherein said gate electrode structure comprises a gate dielectric layer and a work function adjusting metal-containing electrode material positioned above said gate dielectric layer, said gate dielectric layer comprising a high-k dielectric material.

12. The semiconductor device of claim 1, wherein a height level of an upper surface of said second semiconductor material is greater than a height level of an upper surface of said threshold voltage adjusting semiconductor material.

13. The semiconductor device of claim 1, wherein said crystalline buffer layer covers a sidewall surface of said semiconductor base material, said sidewalls of said threshold voltage adjusting semiconductor material, and a sidewall surface of at least said second semiconductor material of said strain-inducing semiconductor material.

14. A semiconductor device, comprising:
a first crystalline semiconductor material positioned on a semiconductor base material of an active region of said semiconductor device and having a first lattice mismatch with respect to said semiconductor base material;
a gate electrode structure positioned on said first crystalline semiconductor material;
a second crystalline semiconductor material embedded in said semiconductor base material of said active region and having a second lattice mismatch with respect to said semiconductor base material;
a third crystalline semiconductor material embedded in said semiconductor base material of said active region, said third crystalline semiconductor material being positioned on said second crystalline semiconductor material and laterally adjacent to said first crystalline semiconductor material and having a third lattice mismatch with respect to said semiconductor base material; and
a liner layer comprising a fourth crystalline semiconductor material, wherein said liner layer laterally surrounds said second and third crystalline semiconductor materials embedded in said semiconductor base material, is positioned between and laterally separates said second crystalline semiconductor material from said semiconductor base material, and is positioned between and laterally separates said third crystalline semiconductor material from said first crystalline semiconductor material, said fourth crystalline semiconductor material having a fourth lattice mismatch with respect to said semiconductor base material that is less than each of said first lattice mismatch, said second lattice mismatch, and said third lattice mismatch.

15. The semiconductor device of claim 14, wherein said first crystalline semiconductor material comprises a threshold voltage adjusting semiconductor material, and wherein said gate electrode structure comprises a gate dielectric layer and a work function adjusting metal-containing electrode material positioned above said gate dielectric layer, said gate dielectric layer comprising a high-k dielectric material.

16. The semiconductor device of claim 14, wherein said third lattice mismatch is different from said fourth lattice mismatch.

17. The semiconductor device of claim 16, wherein at least one of said second lattice mismatch and said third lattice mismatch is less than said first lattice mismatch.

18. The semiconductor device of claim 14, wherein said first, second and third crystalline semiconductor materials comprise an atomic species with a concentration of 10 atomic percent and higher, said atomic species having a covalent radius that is greater than the covalent radius of silicon.

19. The semiconductor device of claim 14, wherein a natural lattice constant of said first crystalline semiconductor material is greater than a natural lattice constant of said semiconductor base material.

20. The semiconductor device of claim 14, wherein at least one of said first and second crystalline semiconductor materials comprise silicon and germanium and wherein said semiconductor base material and said fourth crystalline semiconductor material comprise silicon with a concentration of at least approximately 99 atomic percent.

21. The semiconductor device of claim 14, wherein a height level of an upper surface of said third crystalline semiconductor material is greater than a height level of an upper surface of said first crystalline semiconductor material.

22. The semiconductor device of claim 14, wherein said liner layer covers a sidewall surface of said semiconductor base material and sidewall surfaces of each of said first, second, and third crystalline semiconductor materials.

* * * * *